United States Patent
Grassmann et al.

(10) Patent No.: US 10,211,133 B2
(45) Date of Patent: Feb. 19, 2019

(54) PACKAGE WITH INTERCONNECTIONS HAVING DIFFERENT MELTING TEMPERATURES

(71) Applicant: Infineon Technologies AG, Neubiberg (DE)

(72) Inventors: Andreas Grassmann, Regensburg (DE); Juergen Hoegerl, Regensburg (DE); Angela Kessler, Sinzing (DE); Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/810,733

(22) Filed: Nov. 13, 2017

(65) Prior Publication Data
US 2018/0138111 A1    May 17, 2018

(30) Foreign Application Priority Data
Nov. 14, 2016 (DE) .................. 10 2016 121 801

(51) Int. Cl.
*H01L 21/48* (2006.01)
*H01L 23/495* (2006.01)
(Continued)

(52) U.S. Cl.
CPC .... *H01L 23/49568* (2013.01); *H01L 21/4882* (2013.01); *H01L 23/3735* (2013.01); *H01L 23/49513* (2013.01); *H01L 23/49531* (2013.01); *H01L 23/49575* (2013.01); *H01L 24/29* (2013.01); *H01L 24/30* (2013.01); *H01L 24/32* (2013.01); *H01L 24/73* (2013.01); *H01L 24/83* (2013.01); *H01L 23/4334* (2013.01); *H01L 2224/2912* (2013.01); *H01L 2224/29111* (2013.01); *H01L 2224/29116* (2013.01); *H01L 2224/29139* (2013.01); (Continued)

(58) Field of Classification Search
CPC ......... H01L 23/49568; H01L 23/49513; H01L 21/4882; H01L 24/29; H01L 24/30; H01L 24/32; H01L 24/73; H01L 24/83
See application file for complete search history.

(56) References Cited

U.S. PATENT DOCUMENTS

| 6,703,707 B1* | 3/2004 | Mamitsu | H01L 23/051 257/718 |
| 2001/0031345 A1* | 10/2001 | Araki | H01L 23/3733 428/209 |
| 2006/0108700 A1* | 5/2006 | Nakazawa | H01L 21/565 257/787 |
| 2014/0044479 A1* | 2/2014 | Ueshima | B23K 35/24 403/272 |

(Continued)

FOREIGN PATENT DOCUMENTS

| DE | 102004048529 A1 | 5/2005 |
| DE | 102005047566 A1 | 4/2007 |
| DE | 112009000447 T5 | 3/2011 |
| DE | 102011078582 A1 | 1/2013 |

(Continued)

*Primary Examiner* — Sitaramarao S Yechuri

(57) ABSTRACT

A package comprising at least one electronic chip, a first heat removal body on which the at least one electronic chip is mounted by a first interconnection, a second heat removal body mounted on or above the at least one electronic chip by a second interconnection, and an encapsulant encapsulating at least part of the at least one electronic chip, part of the first heat removal body and part of the second heat removal body, wherein the first interconnection is configured to have another melting temperature than the second interconnection.

3 Claims, 3 Drawing Sheets

(51) Int. Cl.
   *H01L 23/00*    (2006.01)
   *H01L 23/373*   (2006.01)
   *H01L 23/433*   (2006.01)

(52) U.S. Cl.
   CPC ............ *H01L 2224/30181* (2013.01); *H01L 2224/30505* (2013.01); *H01L 2224/32245* (2013.01); *H01L 2224/48091* (2013.01); *H01L 2224/48245* (2013.01); *H01L 2224/73215* (2013.01); *H01L 2224/73265* (2013.01); *H01L 2224/8382* (2013.01); *H01L 2224/8384* (2013.01); *H01L 2224/83447* (2013.01); *H01L 2224/83906* (2013.01); *H01L 2924/014* (2013.01)

(56) References Cited

U.S. PATENT DOCUMENTS

2017/0162468 A1* 6/2017 Ko ..................... H01L 23/3735
2017/0338176 A1* 11/2017 Tsuyuno ........... H01L 23/49838

FOREIGN PATENT DOCUMENTS

| | | |
|---|---|---|
| DE | 102013208350 A1 | 11/2013 |
| DE | 102014100309 A1 | 7/2014 |
| DE | 102013210146 A1 | 12/2014 |
| DE | 102013216709 A1 | 2/2015 |
| DE | 102013220880 A1 | 4/2015 |
| DE | 102015104518 B3 | 3/2016 |
| DE | 102014221142 A1 | 4/2016 |
| EP | 2019429 A1 | 1/2009 |

* cited by examiner

PACKAGE WITH INTERCONNECTIONS HAVING DIFFERENT MELTING TEMPERATURES

BACKGROUND OF THE INVENTION

Field of the Invention

The present invention relates to packages, to a vehicle, to a method of use, and to a method of manufacturing a package.

Description of the Related Art

A power module, for instance for automotive applications, provides a physical containment for power components, usually power semiconductor devices in form of electronic chips comprising one or more integrated circuit components. Examples of integrated circuit components of power modules are an insulated-gate bipolar transistor (IGBT), and a diode.

For such and other packages, it is desired that stacking various elements during packaging is carried out with high spatial accuracy, reproducibility and reliability. Furthermore, it is desirable that the design of a package is not excessively limited by too many constraints. This is however difficult to achieve with conventional approaches.

SUMMARY OF THE INVENTION

There may be a need for a reliable package manufacturable with a high degree of freedom.

According to an exemplary embodiment, a package is provided which comprises at least one electronic chip, a first heat removal body on which the at least one electronic chip is mounted by a first interconnection, a second heat removal body mounted on or above the at least one electronic chip by a second interconnection, and optionally an encapsulant encapsulating at least part of the at least one electronic chip, part of the first heat removal body and part of the second heat removal body, wherein the first interconnection is configured to have another melting (or re-melting) temperature than the second interconnection.

According to another exemplary embodiment, a package is provided which comprises at least one electronic chip, a first heat removal body on which the at least one electronic chip is mounted by a first interconnection, a second heat removal body mounted above the at least one electronic chip, at least one spacer body arranged between the at least one electronic chip and the second heat removal body, a second interconnection connecting the at least one electronic chip with the at least one spacer body, a third interconnection connecting the at least one spacer body with the second heat removal body, and optionally an encapsulant encapsulating at least part of the at least one electronic chip, at least part of the at least one spacer body, part of the first heat removal body and part of the second heat removal body, wherein one of the first interconnection, the second interconnection, and the third interconnection has another melting (or re-melting) temperature than at least one other of the first interconnection, the second interconnection, and the third interconnection.

According to still another exemplary embodiment, a vehicle is provided which comprises one of the packages having the above mentioned features.

According to yet another exemplary embodiment, a method of manufacturing a package is provided, wherein the method comprises mounting at least one electronic chip on a first heat removal body by a first interconnection, mounting a second heat removal body on or above the at least one electronic chip by a second interconnection, optionally encapsulating at least part of the at least one electronic chip, part of the first heat removal body and part of the second heat removal body by an encapsulant, and configuring the first interconnection to have another melting (or re-melting) temperature than the second interconnection.

According to yet another exemplary embodiment, a method of manufacturing a package is provided, wherein the method comprises mounting at least one electronic chip on a first heat removal body by a first interconnection, mounting at least one spacer body on the at least one electronic chip by a second interconnection, and mounting a second heat removal body on the spacer body by a third interconnection, wherein one of the first interconnection, the second interconnection, and the third interconnection has a melting (or re-melting) temperature different from the other two of the first interconnection, the second interconnection, and the third interconnection.

According to yet another exemplary embodiment, one of the packages having the above mentioned features is used for an automotive application.

According to an exemplary embodiment of the invention, a package or module which may be configured for double-sided cooling is provided which has a very high reliability and freedom of design. Such a package sandwiches at least one electronic chip between two opposing heat removal bodies, wherein the entire arrangement may be optionally encapsulated by an encapsulant. During the manufacturing procedure, interconnections are formed between first heat removal body and electronic chip, as well as between electronic chip and second heat removal body (with an optional spacer body in between). It has turned out that, when interconnections used for interconnecting the described constituents are all configured identical (for instance are all made of the same material) and all have the same melting point, all interconnections (even already completed interconnections) may melt simultaneously during the interconnection formation procedures. It has however turned out that such a simultaneous melting of two, three or even more interconnections of the package may result in reliability issues such as the formation of unfilled gaps, positional inaccuracy of individual elements of the package and/or reflow of interconnection material into undesired spaces within the package. However, it has furthermore been recognized by the present inventors that selection of the material, type, temperature characteristics, etc. of the different interconnections of different melting or re-melting temperatures allows to strongly suppress or even eliminate the mentioned and other reliability issues during interconnect procedures of interconnecting the various elements by the various interconnections.

DESCRIPTION OF FURTHER EXEMPLARY EMBODIMENTS

In the following, further exemplary embodiments of the packages, the vehicle, and the methods will be explained.

In the context of the present application, the term "interconnection" may particularly denote an interface or a material capable of interconnecting two constituents of the package (in particular electronic chip with one of heat removal bodies and/or electronic chip with an optional spacer body in between and/or one of heat removal bodies with an optional spacer body) by increasing the temperature up to or above an interconnection temperature at which interconnection between the interconnecting material with the adjacent constituents or between the adjacent constituents without additional interconnection material starts.

In case of a solder material, such a temperature may be the melting temperature of solderable interconnection material.

"Sintering" may in particular denote a process of compacting and forming a solid mass of material by heat and/or pressure without fully melting it beyond the point of liquefaction. A driving force for densification is the change in free energy from the decrease in surface area and lowering of the surface free energy. Sintering may form modified but lower-energy solid-solid interfaces with a total decrease in free energy. In case of sintering, the interconnection temperature may hence be a temperature at which a powderous or granular structure to be interconnected starts forming an integral structure.

Welding is an interconnection technique which does not or does not necessarily involve any or any considerable amount of material in addition to the material of the constituents to be interconnected. Instead of such additional material, a welding interconnection may be formed by the mere supply of thermal energy to an interface of the two constituents to be interconnected. Hence, welding joins materials of the constituents by causing fusion between them by melting these base materials of the constituents directly together. In addition to melting the base material, a filler material may be optionally added to the joint to form a pool of molten material that cools to form a joint that can be as strong, or even stronger, than the base material. Pressure may also be used in conjunction with heat during welding, or by itself, to produce a weld.

In the context of the present application, the term "melting or re-melting temperature" may denote a temperature at which an already formed interconnection is lost or the constituents become separate again, because material of or at the interface of the two constituents becomes liquid or flowable again. It should be said that, with interconnections involving an interconnection material (such as a solder connection involving a solderable material or a sinter connection involving a sinterable material) the interconnection material itself may have the tendency to re-melt when another interconnection is established involving a temperature above the melting temperature of the former interconnection material. However, when a previous interconnection has been established with such an interconnection material, at the interface between the two elements interconnected by the interconnection material, an alloy may have been formed. Such an alloy may comprise material of the interconnection material and in some cases additionally material of one or both of the interconnected constituents. Thus, the interconnect material being now intermingled with adjacent material may have another material composition and thus another re-melting temperature than the originally used interconnection material before establishing the interconnection for the first time. Therefore, the re-melting temperature of interconnection material after the first formation of an interconnection may differ from its original melting temperature.

In view of the foregoing, it may be advantageous to stack the electronic chip(s) and the spacer body/bodies between two heat removal bodies, wherein interconnections of at least two different melting and/or re-melting temperatures may be implemented. Furthermore, it may be advantageous that, after having established one or more of the interconnections involving heating at least up to the respective interconnection temperature, subsequently formed interconnections should be configured so that they involve heating to an interconnection temperature (such as a melting temperature of interconnection material) which is lower than a melting or re-melting temperature of the already previously established one or more interconnections. It can then be prevented that already formed interconnections melt or re-melt and render the constituents of the package spatially inaccurate.

In an embodiment, forming the last of the first interconnection, the second interconnection, and the third interconnection is carried out at a low enough interconnection temperature that the other two previously formed interconnections are prevented from re-melting during forming the last interconnection. A corresponding measure can be taken when only two interconnections are formed: forming the last of the first interconnection and the second interconnection may then be carried out at a low enough interconnection temperature that the other previously formed interconnection is prevented from re-melting during forming the later interconnection. Thus, during formation of the last of the interconnections, a sufficiently moderate temperature may be used for its formation that re-melting of the already beforehand formed other one or two or more interconnections is avoided. This renders it impossible that the already formed other interconnection(s) start(s) becoming soft or even liquid again, which might result in an undesired loss of registration accuracy between the various constituents of the package. The described behaviour may be ensured by a corresponding selection of interconnection materials (with corresponding melting temperatures), interconnection techniques (such as sintering, soldering and welding involving corresponding processing temperatures) and corresponding interconnection temperature, as well as selection of thermal conductivity of all materials of the package under manufacture, etc.

In an embodiment, the first interconnection comprises one of the group consisting of a solder structure and a sinter structure. For example, it is preferred for the first interconnection to be realized by high temperature stable SnSb solder material. It is also preferred for the first interconnection to be realized by a diffusion solder material. Soldering has the advantage of low costs and may involve temperatures of 200° C. to 400° C. Sintering has the advantage of providing a high reliability and involves temperatures of 200° C. to 250° C. However, other interconnections triggered by a temperature increase may be implemented as well.

In particular, the second interconnection may comprise one of the group consisting of a solder structure and a sinter structure. For example, it is preferred for the second interconnection to be realized by a solder material with a high ductility, as can be obtained by Pb solder or SnAg solder. It is also preferred for the first interconnection to be realized by a diffusion solder material. However, other interconnections triggered by a temperature increase may be implemented as well.

In an embodiment, the package comprises at least one electrically conductive spacer body, in particular at least one electrically conductive and thermally conductive spacer body, between the at least one electronic chip and the second heat removal body. Such a spacer body may be for instance a copper block with a selectable height and being capable of balancing out high differences between various elements of the package to be manufactured. A vertical current flow may run through the at least one spacer body during operation of the package. Furthermore, such a spacer body may be made of a highly thermally conductive material such as copper or aluminium and may thereby contribute additionally to the two heat removal bodies to the removal of heat from the package.

In an embodiment, the second interconnection directly connects the at least one electronic chip with the at least one spacer body. In a further embodiment, the package comprises a third interconnection which directly connects the at least one spacer body with the second heat removal body. In such an embodiment, altogether three interconnections are present which can be adjusted individually from one another in terms of melting or re-melting temperature or interconnection temperature.

In an embodiment, the third interconnection comprises one of the group consisting of a welding structure (for instance friction welding or ultrasonic welding), a solder structure and a sinter structure. Welding is cost efficient and may be carried out at moderate temperature. For example, it is preferred for the third interconnection to be realized by welding. It is also preferred for the third interconnection to be realized by a diffusion solder material (for example a CuSn layer). As mentioned above, other interconnection techniques involving triggering the connection only at or above a characteristic temperature can be implemented as well.

In an embodiment, the third interconnection is configured to have a lower melting or re-melting temperature than a material of at least one of the first interconnection and the second interconnection. In such a scenario, the material of the third interconnection melts at first during a system melting procedure. This has turned out to increase reliability of the manufactured package, since not all three interconnections start melting at the same temperature.

In an embodiment, one of the first interconnection, the second interconnection and the third interconnection is configured to have a higher melting or re-melting temperature than the other two of the first interconnection, the second interconnection and the third interconnection. In such an embodiment, melting of one of the interconnections is prevented while the other two interconnections already start melting at a certain temperature. This allows to better define the process and the properties of the resulting package.

In an embodiment, two of the first interconnection, the second interconnection and the third interconnection are configured to have a higher melting or re-melting temperature than the remaining one of the first interconnection, the second interconnection and the third interconnection. In such an embodiment, specifically one of the interconnections starts melting at a relatively low melting temperature and can therefore be handled separately in terms of interconnecting from the other interconnections. Thereby, the reliability of the manufactured package may be improved.

In an embodiment, the first heat removal body is thermally coupled to a first main surface of the at least one electronic chip and is configured for removing thermal energy from the at least one electronic chip. In a further embodiment, the second heat removal body is thermally coupled (directly or indirectly) to a second main surface of the at least one electronic chip and is configured for removing thermal energy from the at least one electronic chip (see for instance FIG. 1). The second heat removal body may also be thermally coupled to a main surface of another electronic chip than an electronic chip thermally coupled to the first heat removal body. Therefore, at least a constituent of the respective heat removal body may be made of a highly thermally conductive material, such as a ceramic (like aluminium oxide, aluminium nitride, silicon nitride, etc.).

In an embodiment, the package is configured for double-sided cooling. In such an embodiment, heat is removed from two opposing main surfaces of the one or more electronic chips. The heat may be dissipated via the heat removal bodies which may form part of an exterior surface of the package.

In an embodiment, the package comprises an electrically conductive contact structure, in particular a leadframe, extending partially within and partially outside of an encapsulant and being electrically coupled with the at least one electronic chip. This allows to electrically connect the encapsulated electronic chip with an electronic periphery. The mentioned leadframe may extend partially within and partially outside (in particular forming one or more exposed leads) of the encapsulant and may be electrically coupled with the at least one electronic chip (for instance by wire bonding). By such an electrically conductive contact structure, the at least one electronic chip may be coupled to an electronic environment of the package. For this purpose, one or more legs of the electrically conductive contact structure may extend beyond the encapsulant.

In an embodiment, the package comprises a chip carrier on which the at least one electronic chip is mounted. It is also possible that more than one chip carrier is provided in the package and/or that more than one electronic chip is mounted on one and the same chip carrier. For example, the at least one electronic chip may be mechanically and/or electrically connected on the chip carrier, for instance by soldering, sintering, adhering, etc. The first heat removal body may be embodied as chip carrier.

In an embodiment, the package comprises electric connection elements, in particular at least one of the group consisting of bond wires, bond ribbons and solder structures, electrically connecting the chip carrier with the electrically conductive contact structure. For example, such electric connection elements may be made of aluminum or copper.

In an embodiment, the first heat removal body is thermally coupled to a first main surface of the at least one electronic chip and is configured for removing thermal energy from the at least one electronic chip, wherein the encapsulant may encapsulate part of the first heat removal body. In an embodiment, the first heat removal body (and/or the second heat removal body) may comprise a material having a high thermal conductivity so as to be capable of efficiently removing heat from the one or more electronic chips to an environment of the package. In particular, the thermal conductivity of at least one of the heat removal bodies as a whole or a material thereof may be at least 10 W/mK, in particular at least 50 W/mK.

In an embodiment, the second heat removal body is thermally coupled to a second main surface of the at least one electronic chip or of at least one further electronic chip and is configured for removing thermal energy from the at least one electronic chip or of the at least one further electronic chip, wherein the encapsulant may encapsulate part of the second heat removal body. The encapsulant may encapsulate part (in particular only part, so that the second heat removal body forms part of an exterior surface of the package, which is advantageous in terms of its heat removal capability) of the second heat removal body. The provision of two heat removal bodies allows for a double-sided cooling architecture.

In an embodiment, the first heat removal body is configured as the above-mentioned chip carrier. In such a configuration, the first heat removal body may simultaneously serve for carrying the at least one electronic chip and for removing heat from the package, which heat is generated by the chip(s) during operation of the package.

In an embodiment, at least one of the first heat removal body and the second heat removal body comprises an electrically insulating (and preferably highly thermally conductive) layer having a first main surface covered by a first electrically conductive layer and having a second main surface covered by a second electrically conductive layer. For example, the electrically insulating layer may be simultaneously highly thermally conductive, which can be accomplished for example by the provision of a ceramic layer. At least one of the electrically conductive layers may be a copper layer combining a high thermal conductivity with a high electrical conductivity. However, aluminum is also a proper material selection for at least one of the electrically conductive layers. For instance, at least one of the first heat removal body and the second heat removal body may be configured as at least one of the group consisting of a Direct Copper Bonding substrate (DCB), and a Direct Aluminum Bonding substrate (DAB).

Alternative chip carriers which may be used for other embodiments can be any interposer like a substrate, a ceramic substrate, a laminar substrate, a leadframe, an IMS (Insulated Metal Substrate), a PCB (printed circuit board), etc.

In an embodiment, the second heat removal body is mounted on the at least one spacer body before mounting the at least one spacer body on the at least one electronic chip. In such an embodiment, the second heat removal body may be mounted on the spacer body, and separately the at least one electronic chip may be mounted on the first heat removal body. Thereby, two double layer stacks are obtained. Subsequently, the two double layer stacks may be interconnected by interconnecting the at least one electronic chip with the at least one spacer body by the second interconnect. Such an embodiment is highly preferred when the third interconnect is manufactured at a high temperature which otherwise would cause a danger of the first interconnect and/or the second interconnect to re-melt. This would cause the lower elements to swim or float on the re-melted first interconnect, which would reduce spatial accuracy and reliability of the package.

Still referring to the previously described embodiment, the at least one electronic chip may be mounted on the first heat removal body before mounting the at least one spacer body on the at least one electronic chip. Thus, it may be advantageous that firstly two separate double structure stacks are formed (i.e. electronic chip(s) on first heat removal body, and second heat removal body on spacer body/bodies), before the two separate double structure stacks are interconnected (for instance by soldering, sintering or welding).

In an embodiment, the encapsulant comprises at least one of the group consisting of a mold compound, and a laminate. In a preferred embodiment, the encapsulant is a mold compound. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity may be embedded in an epoxy-based matrix of the encapsulant.

In an embodiment, the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

In an embodiment, the electronic chip experiences a vertical current flow. The package architecture according to exemplary embodiments of the invention is particularly appropriate for high power applications in which a vertical current flow is desired, i.e. a current flow in a direction perpendicular to the two opposing main surfaces of the electronic chip, one of which being used for mounting the electronic chip on the carrier.

In embodiments, the package may be configured as a half bridge, a cascode circuit, a circuit constituted by a field effect transistor and a bipolar transistor being connected in parallel to one another, or a power semiconductor circuit. Therefore, the packaging architecture according to exemplary embodiments is compatible with the requirements of very different circuit concepts.

In an embodiment, the package is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the package according to an exemplary embodiment is fully compatible with standard packaging concepts (in particular fully compatible with standard TO packaging concepts) and appears externally as a conventional electronic component, which is highly user-convenient. In an embodiment, the package is configured as power module, e.g. molded power module. For instance, an exemplary embodiment of the electronic component may be an intelligent power module (IPM).

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION OF EXEMPLARY EMBODIMENTS

Figure 1:
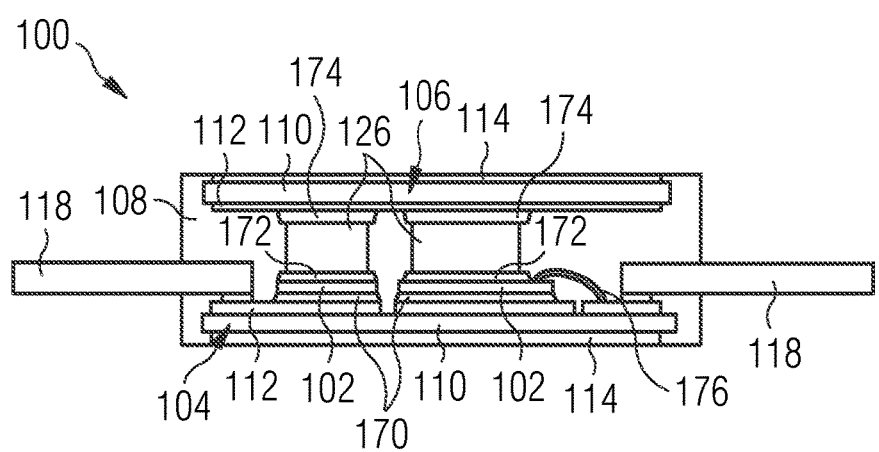
FIG. 1 shows a cross-sectional view of a double-sided cooling package according to an exemplary embodiment.

The illustration in the drawing is schematically.

Before describing further exemplary embodiments in further detail, some basic considerations of the present inventors will be summarized based on which exemplary embodiments have been developed which provide for an electronically reliable package with low loss during operation.

According to an exemplary embodiment of the invention, a double-sided cooling package implementing interconnect layers with different properties is provided.

A package or module may be composed of a lower Direct Copper Bonding substrate (DCB substrate) forming a first heat removal body, a first solder layer (forming a first interconnection), at least one electronic chip, a second solder layer (constituting a second interconnection), a third solder layer, and an upper DCB as an embodiment of a second heat removal body. However, it has turned out that the conventional approach of using identical materials for the three interconnections (i.e. the above-mentioned first, second and third solder layer) involves reliability issues.

The present inventors have found that the mentioned three interconnections of the same material may involve problems during a system soldering procedure. Such a system soldering procedure relates to the formation of an arrangement of lower DCB, chip, spacer and upper DCB. When all three interconnections melt or re-melt at the same temperature, undesired effects may occur. These can be recesses or void areas below the electronic chip, undefined positioning or floating of the spacer bodies, undesired formation of connections of solder material around the spacer, etc. Such effects may conventionally reduce the reliability of the manufactured package.

Moreover, solder material has only limited thermal conductivity so that the thermal performance of such a conventional module may be not sufficient for high performance power applications. Moreover, the space consumption resulting from the floating of the spacer bodies onto a front side of an electronic chip may deteriorate the thermal performance, since the size of the spacer may need to be manufactured lower than the emitter pad.

In order to overcome the above-mentioned and other shortcomings, an exemplary embodiment of the invention provides a package in which the different interconnections are configured so that at least one of the interconnections has a higher melting point than remaining interconnections. This can for instance be accomplished by the implementation of high temperature melting solder material (such as J-Alloy or High Lead). Also the implementation of one or more sinter layers substituting the conventional solder structures is an advantageous measure. Furthermore, welding may be implemented as interconnection technique for any of the interconnections of the package, but highly preferred for the uppermost one.

In a preferred embodiment, at least one of the three mentioned interconnections is embodied as a material with lower melting temperature, since the entire height of the module or chip may be realized with a so-called Solder Jig during system soldering. Tolerances of PCB, chip and spacer can be at least partially equilibrated by adjusting bridging properties of interconnect material (for instance provided by SnAg solder material). What concerns an interconnect below an electronic chip, this may improve the thermal conductivity with regard to the lower DCB. Furthermore, the positional accuracy of the electronic chip(s) may be improved, since floating may be reliably prevented. This also increases the compactness of the device. Moreover, the reliability can be improved by taking the described measure.

The interconnection between electronic chip and spacer body may be configured so that the thermal conductivity with regard to the spacer body is improved. The positional accuracy of the spacer body can be significantly improved, since floating effects may be suppressed. This allows also to configure the spacer body with a larger size, which again further increases the thermal performance of the package.

What concerns the interconnection between spacer body and upper heat removal body, it may be configured so that the thermal conductivity towards the spacer body may be improved. It may be advantageous to form this interconnection from a low melting material.

According to an exemplary embodiment of the invention, a double-sided cooling module for power semiconductor applications is provided which has an electric isolation integrated in the package or module. The interconnections of such a package may be configured so that one of the three interconnections has a higher melting or re-melting point than the remaining interconnect layers. It is also advantageous that two of the three interconnections have a higher melting or re-melting point than the remaining interconnection.

In particular for the third interconnection, welding has turned out as an interesting alternative to soldering or sintering. Welding does not necessarily involve a separate interconnection material, but simply connects the two constituents to be connected when the local temperature in between is sufficiently high to make one or both of the constituents melt.

The following Table 1 shows different embodiments of the invention in terms of configuration of the various interconnections (first interconnection between first heat removal body and at least one electronic chip, second interconnection between at least one electronic chip and at least one spacer body, third interconnection between at least one spacer body and second heat removal body):

TABLE 1

| Embodiment | First Interconnection | Second Interconnection | Third Interconnection |
|---|---|---|---|
| Embodiment A | sinter | solder | solder |
| Embodiment B | solder | sinter | solder |
| Embodiment C | solder | solder | sinter |
| Embodiment D | solder | sinter | sinter |
| Embodiment E | sinter | solder | sinter |
| Embodiment F | sinter | sinter | solder |
| Embodiment G | solder | solder | weld |
| Embodiment H | solder | sinter | weld |
| Embodiment I | sinter | solder | weld |
| Embodiment J | sinter | sinter | weld |

The following Table 2 provides further embodiments of the invention in terms of melting or re-melting temperatures of the various interconnections. In this Table 2, the three mentioned melting or re-melting temperatures X, Y, Z meet the condition X>Y>Z. referring to Table 2, each of the first interconnection, second interconnection and third interconnection may be freely selected from the group of sintering, soldering, and welding.

TABLE 2

| Embodiment | First Interconnection | Second Interconnection | Third Interconnection |
| --- | --- | --- | --- |
| Embodiment I | X | Y | Y |
| Embodiment II | Y | X | Y |
| Embodiment III | Y | Y | X |
| Embodiment IV | X | X | Y |
| Embodiment V | X | Y | X |
| Embodiment VI | Y | X | X |
| Embodiment VII | X | Y | Z |
| Embodiment VIII | X | Z | Y |
| Embodiment IX | Y | X | Z |
| Embodiment X | Y | Z | X |
| Embodiment XI | Z | X | Y |
| Embodiment XII | Z | Y | X |

In the following, three specifically preferred embodiments will be described in more detail:

In a first preferred embodiment, the first interconnection is embodied as a solder interconnection (for instance using Sb-based solder material), the second interconnection is embodied as solder interconnection using the same solder material as the first interconnection, and the third interconnection is embodied as a welding connection.

In a second preferred embodiment, the first interconnection is embodied as a solder interconnection (for instance using diffusion solder material), the second interconnection is embodied as solder interconnection using another solder material (for instance a ductile high-melting solder material such as SnSb-solder or Pb-solder) than the first interconnection, and the third interconnection is embodied as a welding connection.

In a third preferred embodiment, the first interconnection is embodied as a solder interconnection (for instance using SnAg-based solder material), the second interconnection is embodied as solder interconnection using the same solder material as the first interconnection, and the third interconnection is embodied as yet another solder connection (for instance SnSb-based solder).

In all three embodiments, mounting of the spacer bodies on the upper DCB is possible without re-melting of the chips and the lower DCB.

FIG. 1 shows a cross-sectional view of a double-sided cooling package 100 according to an exemplary embodiment.

The package 100 according to FIG. 1 comprises two electronic chips 102 which are here embodied as power semiconductor chips. The electronic chip 102 shown on the left hand side of FIG. 1 may be a diode chip, whereas the electronic chip 102 shown on the right-hand side of FIG. 1 may be an IGBT (Insulated Gate Bipolar Transistor) chip.

A first heat removal body 104, which is here embodied as Direct Copper Bonding (DCB) substrate, is thermally and mechanically coupled to a first main surface of the electronic chips 102 and forms part of an exterior surface of the package 100. The first heat removal body 104 is configured for removing thermal energy from the electronic chips 102 during operation of the package 100 to a package external cooling body and/or cooling fluid (not shown). The first heat removal body 104 comprises a central electrically insulating and thermally conductive layer 110, here made of ceramic material, having a first main surface covered by a first electrically conductive layer 112, which is here embodied as a copper layer, and having an opposing second main surface covered by a second electrically conductive layer 114, which is here embodied as a further copper layer. The electronic chips 102 are mounted and soldered or sintered on the first heat removal body 104 and are electrically connected with the first electrically conductive layer 112 by bond wires 176. Hence, the first heat removal body 104 functions as a chip carrier and as a heat sink. The second electrically conductive layer 114 of the first heat removal body 104 forms part of an exterior surface of the package 100 and thereby significantly contributes to the heat removal from the electronic chips 102 during operation of the package 100.

Optional electrically conductive and thermally conductive spacer bodies 126, which may be embodied as copper blocks, are soldered or sintered onto upper main surfaces of the electronic chips 102.

Moreover, a second heat removal body 106 is thermally coupled to a second main surface of the electronic chips 102 via the spacer bodies 126. Also the second heat removal body 106 comprises a central electrically insulating and thermally conductive layer 110, which may be made of ceramic, having a first main surface covered by a first electrically conductive layer 112, which is here embodied as a copper layer, and having an opposing second main surface covered by a second electrically conductive layer 114, which is here embodied as a further copper layer. The first electrically conductive layer 112 of the second heat removal body 106 is soldered or sintered or welded onto the spacer bodies 126. The second electrically conductive layer 114 of the second heat removal body 106 forms part of an exterior surface of the package 100 and thereby significantly contributes to the heat removal from the electronic chips 102 during operation of the package 100. As a whole, the second heat removal body 106 is configured as a heat sink for removing thermal energy from the electronic chips 102.

An electrically conductive contact structure 118, here embodied as a leadframe, extends partially within and partially outside of the encapsulant 108 and is electrically coupled with the electronic chips 102 via a solder or sinter connection with the patterned first electrically conductive layer 112 of the first heat removal body 104 and via the bond wires 176.

Furthermore, the package 100 comprises a mold-type encapsulant 108 encapsulating the electronic chips 102, the spacer bodies 126, only part of the electrically conductive contact structure 118, only part of the first heat removal body 104 and only part of the second heat removal body 106. The part of the electrically conductive contact structure 118 encapsulated by the encapsulant 108 serves for electrically contacting the electronic chips 102, whereas another part of the electrically conductive contact structure 118 exposed from the encapsulant 108 provides one or more leads for connection with an electronic periphery device (not shown). Since the electrically conductive contact structure 118 extends partially within and partially outside of the encapsulant 108 and is electrically coupled with the electronic chips 102, it is capable of providing an electric coupling between an exterior and an interior of the package 100.

The package 100 may be manufactured as follows: The heat removal bodies 104, 106 as well as the electrically conductive contact structure 118 may be roughened by etching. Thereafter, the electronic chips 102 may be soldered or sintered onto the first heat removal body 104. After that, connection of the electrically conductive contact structure 118 with the first heat removal body 104 may be accomplished by soldering or sintering, wire bonding, etc. Then, the optional spacer bodies 126 may be soldered or sintered on top of the electronic chips 102. This can be followed by a solder or sinter or welding connection of the second heat removal body 106 on the spacer bodies 126. After that, encapsulation by molding may be carried out so that the encapsulant 108 fills the gaps between the mentioned constituents and keeps external surfaces of the heat removal bodies 104, 106 uncovered.

The electronic chips 102 are mounted on the patterned first electrically conductive layer 112 of the first heat removal body 104 by a first interconnection 170. The spacer bodies 126 are mounted on the electronic chips 102 by a second interconnection 172. The first electrically conductive layer 112 of the second heat removal body 106 is mounted on the spacer bodies 126 and above the electronic chips 102 by third interconnection 174. Each of the first interconnection 170, the second interconnection 172 and the third interconnection 174 may be a solder structure or a sinter structure or may be formed by welding.

The first interconnection 170 can be configured to have another melting or re-melting temperature than the second interconnection 172 and the third interconnection 174. Advantageously, the materials of the first interconnection 170, the second interconnection 172 and the third interconnection 174 may be different from one another, in particular may have different melting points. For instance, the first interconnection 170 may be made of a material having another melting temperature than a material of which the second interconnection 172 is made. It is also possible that the third interconnection 174 is made of a material having a lower melting temperature than a material of at least one of the first interconnection 170 and the second interconnection 172. The third interconnection 174 may however also be a welding interconnection which does not involve an additional material. Advantageously, one of the first interconnection 170, the second interconnection 172 and the third interconnection 174 is made of a material having a higher melting temperature than the other two of the first interconnection 170, the second interconnection 172 and the third interconnection 174. It is in particular possible that two of the first interconnection 170, the second interconnection 172 and the third interconnection 174 are made of a material having a higher melting temperature than the remaining one of the first interconnection 170, the second interconnection 172 and the third interconnection 174.

By configuring the interconnections 170, 172, 174 in the described way, the package 100 may be manufactured with high reliability. In particular, spatial accuracy of the electronic chips 102 and of the spacer bodies 126 may be high, because undefined floating due to a simultaneous melting of all interconnections 170, 172, 174 may be prevented. Furthermore, undesired reflow of solder material onto undefined surfaces of the spacer bodies 126 may be prevented. Also, the formation of fjord-shaped recesses or unfilled volumes beneath the electronic chips 102 may be safely prevented.

Figure 2:
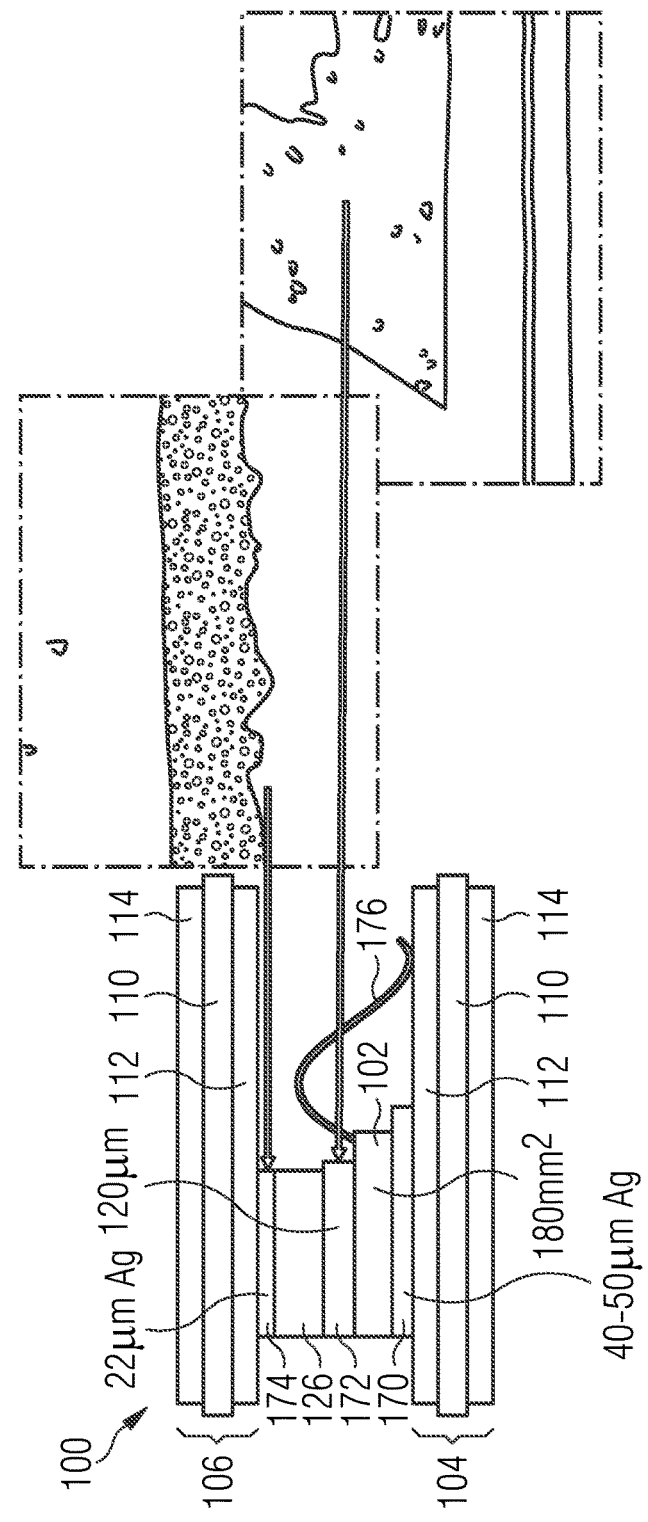
FIG. 2 is an image showing a cross-sectional view of a package according to an exemplary embodiment.

FIG. 2 is an image showing a cross-sectional view of a package 100 according to an exemplary embodiment.

FIG. 2 shows an embodiment in which the electronic chip 102 is sintered on a lower DCB (Direct Copper Bonding substrate) as first heat removal body 104. Spacer bodies 126 are soldered onto a front side of the electronic chip 102. Furthermore, the spacer bodies 126 may be soldered onto an upper DCB as second heat removal body 106. A very high reliability can be obtained with this type of package 100.

Figure 3:
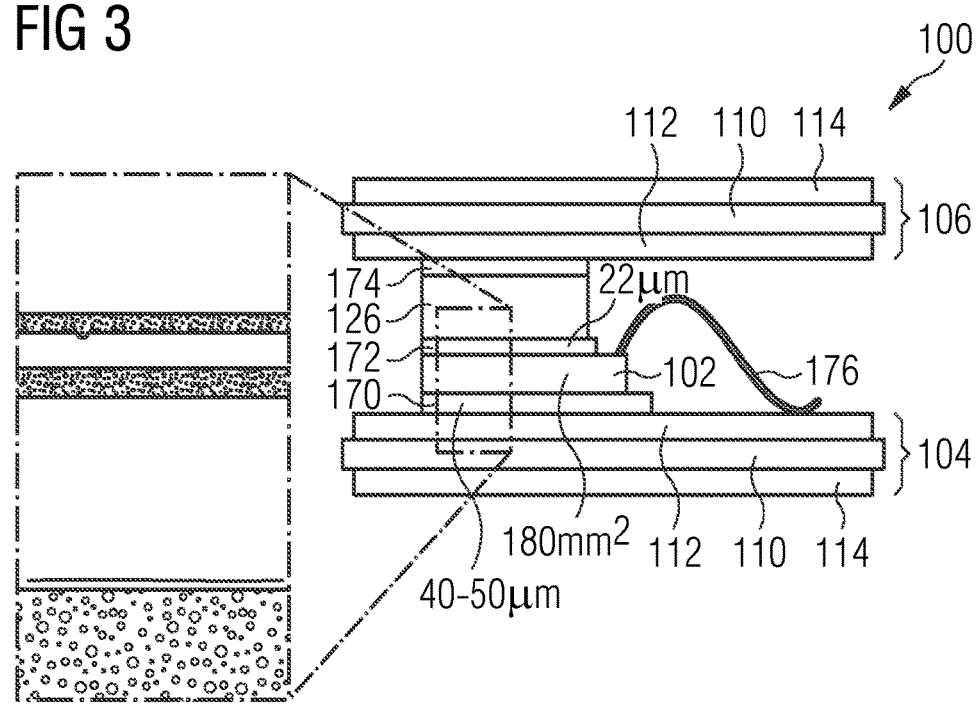
FIG. 3 is an image showing a cross-sectional view of a package according to another exemplary embodiment.

FIG. 3 is an image showing a cross-sectional view of a package 100 according to another exemplary embodiment.

Referring to the embodiment of FIG. 3, the electronic chip 102 has been sintered on a lower DCB as first heat removal body 104. The spacer bodies 126 are sintered on the front side of the electronic chip 102. The spacer bodies 126 are furthermore soldered onto an upper DCB as second heat removal body 106.

Also with the embodiment of FIG. 3, a very high reliability may be achieved.

Figure 4:
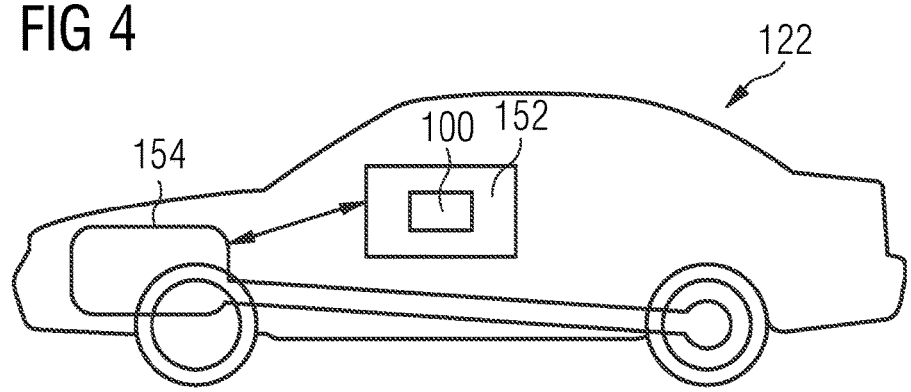
FIG. 4 shows a schematic view of a vehicle with a package according to an exemplary embodiment.

FIG. 4 shows a schematic view of a vehicle 122 with a package 100 according to an exemplary embodiment.

More specifically, the power package 100 may form part of a control block 152 controlling operation of engine/battery block 154. Hence, a package 100 or power module according to an exemplary embodiment of the invention may be used for an automotive application. A preferred application of such a power package 100 is an implementation as an inverter circuit or inverted rectifier for vehicle 122 which may be an electrically driven vehicle or which may be a hybrid vehicle. Such an inverter may transfer a direct current (DC) of the battery into an alternating current (AC) for driving the electric engine of vehicle 122. In a hybrid vehicle, it is also possible to at least partially recover mechanical energy and to transfer it, by the inverter, back into electric energy to recharge the battery. In such an automotive inverter application, extreme amounts of heat are generated during operation of the power package 100. This heat can be efficiently removed by the double-sided cooling concept described above. However, it should be said that, in other embodiments, also single-sided cooling may be sufficient.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a package, wherein the method comprises:
   mounting at least one electronic chip on a first heat removal body by a first interconnection;
   mounting at least one spacer body on the at least one electronic chip by a second interconnection;
   mounting a second heat removal body on the spacer body by a third interconnection;
   wherein one of the first interconnection, the second interconnection, and the third interconnection has a melting temperature different from the other two of the first interconnection, the second interconnection, and the third interconnection;
   wherein the second heat removal body is mounted on the at least one spacer body before mounting the at least one spacer body on the at least one electronic chip.

2. The method according to claim 1, wherein the at least one electronic chip is mounted on the first heat removal body before mounting the at least one spacer body on the at least one electronic chip.

3. The method according to claim 1, wherein forming the last of the first interconnection, the second interconnection, and the third interconnection is carried out at a low enough interconnection temperature that the other two previously formed interconnections are prevented from melting or re-melting during forming the last interconnection.

\* \* \* \* \*